US006093297A

United States Patent [19]

Tomura et al.

[11] Patent Number: 6,093,297

[45] Date of Patent: Jul. 25, 2000

[54] METHOD FOR DEPOSITING SOLID ELECTROLYTE LAYER

[75] Inventors: Keiji Tomura, Kawasaki; Tohru Shiomitsu; Takashi Ogawa, both of Yokohama; Yasuhiko Manabe, Hiratsuka; Yotaro Ohno, Tokyo, all of Japan

[73] Assignee: NKK Corporation, Tokyo, Japan

[21] Appl. No.: 09/162,536

[22] Filed: Sep. 29, 1998

[51] Int. Cl.[7] .............................. C08F 2/58; C23C 28/00; C23F 17/00; C25D 13/00; C25D 15/00

[52] U.S. Cl. .......................... 204/487; 204/484; 204/486; 204/490; 204/491; 427/255.36

[58] Field of Search .................................... 204/487, 484, 204/486, 490, 491; 427/255.36, 255.32

[56] References Cited

U.S. PATENT DOCUMENTS

| | | | |
|---|---|---|---|
| 4,609,562 | 9/1986 | Isenberg et al. | 427/8 |
| 5,700,361 | 12/1997 | Shiomitsu et al. | 204/491 |
| 5,989,634 | 11/1999 | Isenberg | 427/255.32 |

FOREIGN PATENT DOCUMENTS

| | | |
|---|---|---|
| 62-268063 | 11/1987 | Japan . |
| 63-164174 | 7/1988 | Japan . |
| 63-285877 | 11/1988 | Japan . |

*Primary Examiner*—Kathryn Gorgos
*Assistant Examiner*—Wesley A. Nicolas
*Attorney, Agent, or Firm*—Frishauf, Holtz, Goodman, Langer & Chick, P.C.

[57] ABSTRACT

A method for depositing solid electrolyte layer includes the steps of depositing a solid electrolyte layer on an electrode substrate by an electrophoretic deposition process, firing the solid electrolyte layer at a temperature of 1,300° C. or less, and depositing another electrolyte layer on the fired solid electrolyte layer by a CVD-EVD process. In accordance with the method, thin and sufficiently dense solid electrolyte layers which are suitable for solid electrolyte fuel cells can be easily produced.

18 Claims, No Drawings

METHOD FOR DEPOSITING SOLID ELECTROLYTE LAYER

BACKGROUND OF THE INVENTION

1. Field of the Invention

The present invention relates to a method for depositing solid electrolyte layers used in fuel cells and the like.

2. Description of Related Art

A fuel cell using a solid electrolyte has a basic structure which includes an anode, an electrolyte layer, and a cathode, and generates electricity in accordance with the following principle.

At a temperature of approximately 1,000° C., a fuel gas such as hydrogen is fed into the anode and an oxidation gas such as air is fed into the cathode so that oxygen in the oxidation gas is electrochemically reduced to negative ions at the interface between the cathode and the electrolyte. The oxygen ions pass through the electrolyte layer toward the anode by means of a difference in oxygen partial pressure between two sides of the electrolyte layer as the driving force, and are electrochemically oxidized by a reaction with the fuel gas at the anode. If the anode and the cathode are electrically connected at this stage, electricity can be obtained.

In such a solid electrolyte fuel cell, since higher generation efficiency can be obtained as resistance of the electrolyte layer decreases, it is desirable that the electrolyte layer be as thin as possible. The layer will easily break, however, if the thickness of the layer is decreased, and thus,the electrolyte layer is generally deposited at a thickness of several tens of microns to several hundreds of microns on an anode or a cathode as a substrate in order to ensure sufficient mechanical strength.

Also, if the electrolyte layer is porous and is not sufficiently dense for the gas used, oxygen gas passes through the electrolyte layer without being ionized, resulting in significant deterioration in the generation efficiency of the fuel cell. Thus, it is also desirable that the electrolyte layer be dense.

There are various methods for depositing a solid electrolyte layer on an electrode substrate, such as a chemical vapor deposition-electrochemical vapor deposition (CVD-EVD) process, a slurry dipping process, an electrophoretic deposition process, and a thermal spraying process by plasma-jet or the like.

In the CVD-EVD process, as disclosed in U.S. Pat. No. 4,609,562, an electrolyte layer is formed by reacting a metal compound gas with an oxidizing gas such as water vapor or oxygen at high temperatures. A dense layer having a thickness of several tens of microns can be deposited in this process; however, the yield is significantly low since the raw materials are supplied in a gas phase, and productivity is also significantly low because of very slow deposition rates.

In the slurry dipping process and the thermal spraying process, zirconia particles or the like as a material are deposited on a substrate to form an electrolyte layer. Although the deposition rate in these processes is significantly higher than that in the CVD-EVD process, the layer tends to be porous, and thus it is difficult to form a completely dense electrolyte layer on an electrode substrate for a fuel cell. Also, in the electrophoretic deposition process, electrolyte particles having a given zeta electric potential migrate by means of a potential gradient generated in the electric cell so that they are deposited on the substrate. Although this process has a high deposition rate and is excellent in forming a dense layer, as disclosed in U.S. Pat. No. 5,700,361, repeated deposition is required in order to form a completely dense electrolyte layer on an electrode substrate for a fuel cell, resulting in significantly low productivity.

Accordingly, in order to form a dense electrolyte layer without significantly decreasing productivity, two-stage deposition methods have been disclosed in, for example, Japanese Patent Publications Nos. 62-268063, 63-164174, and 63-285877, in which, an electrolyte layer is deposited nearly up to a desired thickness by the slurry dipping process or the thermal spraying process having a fast deposition rate, and then, the same electrolyte is further deposited on the porous layer for a short period of time to achieve the desired thickness and to densify by sealing the layer by a CVD process, the CVD-EVD process, or a physical vapor deposition (PVD) process.

In accordance with the slurry dipping process, however, a binder is used in order to increase viscosity of the slurry of electrolyte particles. Since pores are produced by the binder remaining in the layer, sealing cannot be completely performed by the subsequent CVD-EVD process, and thus a sufficiently dense layer cannot be formed. Also, it is difficult to obtain a uniform thickness because of dripping during deposition.

In accordance with the thermal spraying process, deposition is performed by spraying particles, which are molten at high temperatures, onto a substrate at high speed, by means of deformation of the particles during collision. However, because of the nature of the process, closed pores remain, and thus, sealing cannot be completely performed by the subsequent CVD-EVD process. Accordingly, a sufficiently dense layer cannot be formed, the same as in the slurry dipping process. Also, since the thickness and density vary depending on the spraying duration and the spraying angle, it is difficult to control the thickness and density of a electrolyte layer having a complex and wide area.

SUMMARY OF THE INVENTION

It is an object of the present invention to provide a method for easily producing solid electrolyte layers which are thin and sufficiently dense.

The object described above is achieved by a method including the steps of depositing a solid electrolyte layer on an electrode substrate by an electrophoretic deposition process, firing the solid electrolyte layer at a temperature of 1,300° C. or less, and depositing another electrolyte layer on the solid electrolyte layer by a CVD-EVD process.

The difference in pressure (P1–P2) between the pressure P1 of a metal compound gas and the pressure P2 of an oxidation gas is preferably set at −3 to 10 Torr in the CVD-EVD process, for forming the solid electrolyte layer.

When the solid electrolyte layer is composed of a stabilized zirconia layer, gaseous zirconium chloride is preferably used as the metal compound gas in the CVD-EVD process.

DETAILED DESCRIPTION OF THE INVENTION

In the electrophoretic deposition process, a binder that is required in the slurry dipping process is not used, and all the spaces between electrolyte particles are in an open state. Also, since electrolyte particles having a given zeta electric potential are migrated by means of a potential gradient generated in the electric cell so that they are deposited on a substrate, the electrolyte particles prefer to migrate toward and electrically deposit on portions having a larger potential gradient, such as a portion which has a thin electrolyte layer or a portion which has low deposition density, a layer having a uniform thickness and deposition density can be formed.

Accordingly, after an electrolyte layer is deposited on the electrode substrate by the electrophoretic deposition process, by depositing the solid electrolyte layer by the CVD-EVD process, a gas used in the CVD-EVD process can penetrate into the spaces between the electrolyte particles, and thus the thin and sufficiently dense solid electrolyte layer can be formed.

In order to securely adhere the solid electrolyte layer on the electrode substrate, firing is performed after the solid electrolyte layer is formed by the electrophoretic deposition process. If the firing temperature exceeds 1,300° C., interdiffusion between elements constituting the electrode substrate and the electrolyte layer may significantly increase, or separation may occur at the interface between the layer formed by the electrophoretic deposition process and the layer formed by the CVD-EVD process, resulting in significant deterioration in generation efficiency of the fuel cell. Accordingly, firing is performed at a temperature of 1,300° C. or less.

If the CVD-EVD process is performed under these conditions, in which the difference in pressure (P1−P2) between the pressure P1 of a metal compound gas and the pressure P2 of an oxidation gas is set in the range of −3 to 10 Torr, the treatment duration of the CVD-EVD process required for densifying the layer by sealing can be reduced.

When the solid electrolyte layer is composed of stabilized zirconia, by the CVD-EVD process using gaseous zirconium chloride, a dense stabilized zirconia layer can be easily formed.

Also, in the CVD-EVD process, deterioration of the electrode substrate may occur during deposition because a chloride gas such as zirconium chloride or yttrium chloride is used at high temperatures. In accordance with the present invention, however, since an electrolyte layer is preliminarily formed on the electrode substrate by the electrophoretic deposition process, the chloride gas does not directly come into contact with the electrode substrate, and thus, deterioration of the electrode substrate can be prevented.

EXAMPLE 1

As an electrode substrate, porous lanthanum calcium manganite, also functioning as an air electrode in a solid electrolyte fuel cell, was used. A stabilized zirconia layer was deposited on the substrate by an electrophoretic deposition process in a bath containing 20 g of stabilized zirconia particles (8 mol % $Y_2O_3/ZrO_2$) and 0.5 g of iodine per 1 liter of acetylacetone as a solvent. Then, firing was performed for 6 hours while changing the temperature in the range of 1,000 to 1,500° C. in air. At this stage, the layer had a thickness of 20 to 30 $\mu$m, and a porosity in the layer was approximately 30%.

Next, a gas containing vaporized zirconium chloride and yttrium chloride was fed to the electrolyte side with the pressure P1, and oxygen gas containing water vapor as oxidation gas was fed to the bare side of substrate with the pressure P2. While maintaining the difference in pressure (P1−P2) at 1.5 Torr, the CVD-EVD process was performed at 1,200° C. for a period of time required for sealing, plus 45 minutes so that stabilized zirconia was deposited in a thickness of 30 to 40 $\mu$m to produce samples 1 through 6.

Sealing time by the CVD-EVD process was measured. Also, a fuel electrode composed of platinum paste was provided on the surface of the electrolyte layer of each sample having a two-layered structure including an air electrode and an electrolyte layer to form a generating cell, and generation efficiency was measured.

The sealing time corresponds to a period from the start of the CVD-EVD treatment until the stage in which the partial pressure of oxygen gas in the electrolyte side gas sharply decreases, and was measured by monitoring the partial pressure of oxygen gas, which was fed to the substrate during the CVD-EVD treatment, effusing into the electrolyte.

The generation efficiency was evaluated by an electric power density at a generator potential of 600 mV when power generation testing was performed at 1,000° C. using a mixed gas of hydrogen and water vapor as a fuel gas and oxygen as an oxidation gas.

The results are shown in Table 1.

With respect to the samples 1 through 4 in accordance with the present invention, in which electrolyte layers composed of stabilized zirconia were formed on lanthanum calcium manganite electrode substrates by the electrophoretic deposition process, and after firing at a temperature of 1,300° C. or less in air, stabilized zirconia was deposited by the CVD-EVD process using a gaseous compound containing zirconium, the sealing time was short, and the generation efficiency was excellent with an electric power density of 0.3 W/cm$^2$ or more.

On the other hand, with respect to the samples 5 and 6, in which the firing temperature exceeded 1,300° C., although the sealing time was short, the generation efficiency was significantly inferior with an electric power density of 0.06 W/cm$^2$ or less because of problems such as interdiffusion between the electrode substrate and the electrolyte layer.

TABLE 1

| Sample | Firing Temperature (°C.) | Sealing Time (minutes) | Electric Power Density (W/cm$^2$) | Remarks |
|---|---|---|---|---|
| 1 | 1,000 | 64 | 0.33 | Example of This Invention |
| 2 | 1,100 | 58 | 0.32 | " |
| 3 | 1,200 | 45 | 0.44 | " |
| 4 | 1,300 | 27 | 0.33 | " |
| 5 | 1,400 | 19 | 0.06 | Comparative Example |
| 6 | 1,500 | 20 | 0 | " |

EXAMPLE 2

After firing the layers deposited by the electrophoretic deposition process at a temperature of 1,250° C. in a manner similar to that in Example 1, stabilized zirconia was deposited by the CVD-EVD process in a manner similar to that in Example 1 while setting the difference in pressure (P1−P2) in the range of −8 to 20 Torr to produce the samples 7 through 13.

Then, the sealing time was measured in the same way as in Example 1.

The results are shown in Table 2.

With respect to the samples 8 through 12, in which the diffrence in pressure (P1−P2) is in the range of −3 to 10 Torr a short sealing time of less than 2 hours can be achieved.

With respect to the samples 7 and 13, in which the differences in pressure (P1−P2) are 20 Torr and −8 Torr respectively, the sealing time is over 180 minutes.

TABLE 2

| Sample | Difference in Pressure (Torr) | Sealing Time (minutes) |
|---|---|---|
| 7 | 20 | over 180 |
| 8 | 10 | 115 |
| 9 | 7 | 102 |
| 10 | 3 | 51 |
| 11 | 0 | 40 |
| 12 | −3 | 75 |
| 13 | −8 | over 180 |

What is claimed is:

1. A method for depositing a solid electrolyte layer comprising:

depositing a solid electrolyte layer on an electrode substrate by an electrophoretic deposition process;

firing said solid electrolyte layer at a temperature of 1,300° C. or less; and depositing another electrolyte layer on said solid electrolyte layer by a chemical vapor deposition-electrochemical vapor deposition (CVD-EVD) process.

2. The method according to claim 1, wherein the chemical vapor deposition-electrochemical vapor deposition process is carried out with a metal compound gas at a pressure P1 and an oxidation gas at a pressure P2; and a difference in pressure (P1−P2) between the pressure P1 of the metal compound gas and the pressure P2 of the oxidation gas is −3 to 10 Torr.

3. The method according to claim 2, wherein said solid electrolyte layer comprises a stabilized zirconia layer, and the metal compound gas comprises gaseous zirconium chloride.

4. The method according to claim 3 wherein the firing is carried out at a temperature of 1,000° C. to 1,300° C.

5. The method according to claim 2, wherein the difference in pressure is 1.5 Torr.

6. The method according to claim 2, wherein the difference in pressure is −3 Torr.

7. The method according to claim 2, wherein the difference in pressure is 0 Torr.

8. The method according to claim 2, wherein the difference in pressure is 3 Torr.

9. The method according to claim 2, wherein the difference in pressure is 7 Torr.

10. The method according to claim 2, wherein the difference in pressure is 10 Torr.

11. The method according to claim 1, wherein said solid electrolyte layer comprises a stabilized zirconia layer, and the chemical vapor deposition-electrochemical vapor deposition process is carried out with a metal compound gas which comprises gaseous zirconium chloride.

12. The method according to claim 11, wherein the chemical vapor deposition-electrochemical vapor deposition process is carried out at a temperature to deposit stabilized zirconia to a thickness of 30 to 40 $\mu$m.

13. The method according to claim 1, wherein the electrode substrate is porous lanthanum calcium manganite.

14. The method according to claim 1, wherein the firing is carried out at a temperature of 1,000° C. to 1,300° C.

15. The method according to claim 14, wherein the firing is carried out at 1,100° C.

16. The method according to claim 14, wherein the firing is carried out at 1,200° C.

17. The method according to claim 14, wherein the firing is carried out at 1,300° C.

18. The method according to claim 14, wherein the firing is carried out at 1,000° C.

* * * * *